US009252575B2

(12) United States Patent
Toyama et al.

(10) Patent No.: US 9,252,575 B2
(45) Date of Patent: Feb. 2, 2016

(54) HIGH-VOLTAGE CONDUCTION PATH AND WIRING HARNESS (71) Applicant: Yazaki Corporation, Tokyo (JP)

(72) Inventors: Eiichi Toyama, Kosai (JP); Shigemi Hashizawa, Kosai (JP)

(73) Assignee: Yazaki Corporation, Tokyo (JP)

( * ) Notice: Subject to any disclaimer, the term of this patent is extended or adjusted under 35 U.S.C. 154(b) by 18 days.

(21) Appl. No.: 14/162,827

(22) Filed: Jan. 24, 2014

(65) Prior Publication Data

US 2014/0138153 A1    May 22, 2014

Related U.S. Application Data (63) Continuation of application No. PCT/JP2012/068881, filed on Jul. 25, 2012.

(30) Foreign Application Priority Data

Jul. 25, 2011    (JP) .................................. 2011-161511

(51) Int. Cl.
  *H01B 9/00* (2006.01)
  *H02G 3/02* (2006.01)
  *B60R 16/02* (2006.01)
  (Continued)

(52) U.S. Cl.
  CPC .............. *H02G 3/02* (2013.01); *B60R 16/0215* (2013.01); *H01B 9/006* (2013.01); *H01R 9/0518* (2013.01); *H02G 3/38* (2013.01); *H05K 9/0098* (2013.01); *H01B 9/04* (2013.01); *H01R 4/185* (2013.01);

(Continued)

(58) Field of Classification Search
  CPC .................................. H01B 9/006; H02G 3/02
  USPC ......................................... 174/72 A; 74/502.5
  See application file for complete search history.

(56) References Cited

U.S. PATENT DOCUMENTS 969,660 A * 9/1910 Schmidt et al. .................. 464/58
2,092,898 A * 9/1937 Tondeur ......................... 464/174
(Continued)

FOREIGN PATENT DOCUMENTS

CN    1710752 A    12/2005
DE    1192284 B    5/1965
(Continued)

OTHER PUBLICATIONS

English-Language Translation of Written Opinion dated Oct. 2, 2012 issued by the International Searching Authority in corresponding Application No. PCT/JP2012/068881 (PCT/ISA/237).

(Continued)

*Primary Examiner* — Timothy Thompson
*Assistant Examiner* — Michael F McAllister
(74) *Attorney, Agent, or Firm* — Sughrue Mion, PLLC (57) ABSTRACT A high-voltage conduction path includes one conductor of a positive electrode conductor and a negative electrode conductor, a first insulator on the outside of the one conductor, the other conductor of the positive electrode conductor and the negative electrode conductor, the other conductor on the outside of the first insulator, and a second insulator on the outside of the other conductor. The other conductor is made of a metal wire material and formed into a cylindrical shape by spirally winding the metal wire material, and portions of the metal wire material positioned to be adjacent to each other contact with each other at side end faces opposed to each other.

6 Claims, 3 Drawing Sheets (51) Int. Cl.
*H05K 9/00* (2006.01)
*H02G 3/38* (2006.01)
*H01R 9/05* (2006.01)
*H01B 7/00* (2006.01)
*H01B 9/04* (2006.01)
*H01R 4/18* (2006.01)
*H01R 4/20* (2006.01)
*H02G 3/04* (2006.01)

(52) U.S. Cl.
CPC .............. *H01R 4/20* (2013.01); *H01R 2201/26* (2013.01); *H02G 3/0481* (2013.01)

(56) References Cited

U.S. PATENT DOCUMENTS

| | | | | |
|---|---|---|---|---|
| 2,136,258 | A | * | 11/1938 | Vrooman .................. 174/43 |
| 4,423,620 | A | * | 1/1984 | Hogenhout et al. .......... 72/430 |
| 4,642,417 | A | * | 2/1987 | Ruthrof et al. ............. 174/36 |
| 4,731,502 | A | * | 3/1988 | Finamore .................. 174/74 R |
| 4,970,352 | A | * | 11/1990 | Satoh ..................... 174/106 R |
| 5,091,604 | A | * | 2/1992 | Kirma ..................... 174/2 |
| 6,246,006 | B1 | * | 6/2001 | Hardin et al. ............. 174/106 R |
| 7,439,447 | B2 | * | 10/2008 | Galey et al. .............. 174/105 R |
| 2004/0099427 | A1 | | 5/2004 | Kihira |
| 2005/0282434 | A1 | | 12/2005 | Morikawa |
| 2006/0278423 | A1 | | 12/2006 | Ichikawa et al. |
| 2008/0196538 | A1 | * | 8/2008 | Morimoto et al. ........... 74/502.5 |
| 2010/0236810 | A1 | * | 9/2010 | Mukai et al. .............. 174/105 R |
| 2011/0088944 | A1 | | 4/2011 | Ogue et al. |

FOREIGN PATENT DOCUMENTS

| | | |
|---|---|---|
| EP | 1113461 A1 | 7/2001 |
| JP | 5828107 A | 2/1983 |
| JP | 8153545 A | 6/1996 |
| JP | 1040745 A | 2/1998 |
| JP | 2001189113 A | 7/2001 |
| JP | 2004171952 A | 6/2004 |
| JP | 2006156051 A | 6/2006 |
| JP | 200759085 A | 3/2007 |
| JP | 200780622 A | 3/2007 |
| JP | 2009214631 A | 9/2009 |
| JP | 201012868 A | 1/2010 |
| WO | 2011024262 A1 | 3/2011 |

OTHER PUBLICATIONS

Office Action dated May 25, 2015 issued by the State Intellectual Property Office of P.R. China in corresponding Application No. 201280036366.3.
Communication dated Mar. 11, 2015 issued by the European Patent Office in counterpart European Patent Application No. 12818025.4.
International Search Report, dated for Oct. 2, 2012, issued by the International Searching Authority in counterpart International Application No. PCT/JP2012/068881.
Written Opinion, dated Oct. 2, 2012, issued by the International Searching Authority in counterpart International Application No. PCT/JP2012/068881.
Communication from the Japanese Patent Office dated Oct. 6. 2015 in a counterpart Japanese application No. 2011-161511.

* cited by examiner

HIGH-VOLTAGE CONDUCTION PATH AND WIRING HARNESS

CROSS-REFERENCE TO RELATED APPLICATION

This application is a continuation of PCT application No. PCT/JP2012/068881, which was filed on Jul. 25, 2012, based on Japanese Patent Application No. 2011-161511 filed on Jul. 25, 2011, the contents of which are incorporated herein by reference.

BACKGROUND OF THE INVENTION

1. Technical Field

The present invention relates to a high-voltage conduction path and a wiring harness.

2. Background Art

A wiring harness suitable for hybrid vehicles or electric vehicles is disclosed in the following PTL1. The wiring harness disclosed in PTL1 is provided to connect a battery and an inverter unit and includes two high-voltage conduction paths, each of which is a positive circuit and a negative circuit. In the wiring harness, two high-voltage conduction paths are routed side by side (in parallel). Further, two high-voltage conduction paths are routed in such a way that bending is carried out along a desired path.

PTL1: JP-A-2010-012868

SUMMARY OF INVENTION

However, in the wiring harness of the prior art, the high-voltage conduction path is responsible for transmission of power of a drive system and therefore made of a thick wire. Further, two high-voltage conduction paths are routed side by side and therefore the following problems occur. Specifically, since two thick wires are routed side by side, there is a problem that a routing space corresponding to two wires in a width direction must be secured. Further, since two thick wires are routed side by side, there is a problem that constraint occurs in a bending direction and therefore impact on path formation is brought about.

The present invention has been made in view of the above circumstances and an object thereof is to provide a high-voltage conduction path and a wiring harness, which are capable of achieving space saving and facilitating path formation.

In order to solve the above-described problems, a high-voltage conduction path of the present invention includes one conductor of a positive electrode conductor and a negative electrode conductor, a first insulator provided on the outside of the one conductor, the other conductor of the positive electrode conductor and the negative electrode conductor, the other conductor being provided on the outside of the first insulator, and a second insulator provided on the outside of the other conductor. The other conductor is made of a metal wire material and formed into a cylindrical shape by spirally winding the metal wire material. Portions of the metal wire material positioned to be adjacent to each other are configured in such a way that side end faces opposed to each other come into contact with each other.

According to the present invention having such characteristics, a positive circuit and a negative circuit are included in a single configuration and therefore the high-voltage conduction path is capable of achieving space saving, as compared to a case where two high-voltage conduction paths are provided side by side. In the high-voltage conduction path, one conductor of the positive electrode conductor and the negative electrode conductor is arranged on the inside and the other conductor thereof is arranged on the outside. The other conductor arranged on the outside has a flexible structure that is formed by spirally winding the metal wire material. With such a flexible structure, it is easy to form a desired bent shape. In other words, path formation is facilitated.

The positive electrode conductor and the negative electrode conductor are arranged concentrically, for example. When positive-side current is supplied to the positive electrode conductor and negative-side current is supplied to the negative electrode conductor in a direction opposite to and in parallel with the positive-side current supplied to the positive electrode conductor, magnetic fields that are generated from each of the positive electrode conductor and the negative electrode conductor are cancelled each other. As a result, the magnetic field generated from the high-voltage conduction path is eliminated. In other words, it is possible to achieve a magnetic shielding effect. In the high-voltage conduction path of the present invention or a wiring harness including the high-voltage conduction path, there is no case that impact of noise is applied to other conduction path or equipment that is adjacent to the high-voltage conduction path.

In addition, the other conductor can absorb the heat generated in the one conductor and disperse the heat over the whole of the other conductor or can prevent the heat from the outside from being transmitted to the one conductor.

Further, in the high-voltage conduction path of the present invention, the metal wire material includes a first metal wire material and a second metal wire material, which have a cross-section shape different from each other. The other conductor is formed by spirally winding the first metal wire material and the second metal wire material and portions of the first metal wire material and the second metal wire material positioned to be adjacent to each other, alternately, are configured in such a way that side end faces opposed to each other come into contact with each other.

According to the present invention having such characteristics, the other conductor of the positive electrode conductor and the negative electrode conductor is formed by spirally winding the first metal wire material and the second metal wire material, which have a cross-section shape different from each other. Since the first metal wire material and the second metal wire material, constituting the other conductor, have a cross-section shape different from each other, it is possible to generate a difference in the bent shape of the other conductor at the time of bending the other conductor. With the difference in the bent shape, a gap hardly occurs between the side portions of the first metal wire material and the second metal wire material, which are adjacent to each other.

Further, the high-voltage conduction path of the present invention further includes an end terminal connected to a terminal of the other conductor. The end terminal includes an inner end terminal that is positioned inside of the terminal and comes into contact with an inner surface of the metal wire material, an outer end terminal that is positioned outside of the terminal and comes into contact with an outer surface of the metal wire material and an electrical contact portion for external connection provided continuously to one end terminal of the inner end terminal and the outer end terminal.

According to the present invention having such characteristics, it is possible to provide an end terminal for external connection to a terminal of the other conductor arranged on the outside, by employing the end terminal including the inner end terminal and the outer end terminal.

Further, the high-voltage conduction path of the present invention further includes an electromagnetic shielding member provided on the outside of the second insulator and a sheath provided on the outside of the electromagnetic shielding member.

According to the present invention having such characteristics, it is also possible to obtain an electromagnetic shielding effect, in addition to the magnetic shielding effect. The high-voltage conduction path has a configuration and structure that is capable of obtaining a large shielding effect. Here, the positive electrode conductor, the negative electrode conductor and the electromagnetic shielding member form a substantially coaxial three-layer structure.

In order to solve the above-described problems, a wiring harness of the present invention includes the high-voltage conduction path as described above.

According to the present invention having such characteristics, it is possible to obtain the wiring harness including the high-voltage conduction path that is capable of achieving space saving and facilitating path formation.

According to the present invention, a positive circuit and a negative circuit are included in a single-line configuration and a structure formed by spirally winding a metal wire material is included in order to impart flexibility. Accordingly, there is an effect that it is possible to achieve space saving or facilitate path formation, as compared to a prior art.

Further, according to the present invention, there is an effect that it is possible to provide a better structure to the other conductor of the positive electrode conductor and the negative electrode conductor.

Further, according to the present invention, there is an effect that it is possible to provide a better structure to an end terminal connected to a terminal.

Further, according to the present invention, there is an effect that it is possible to improve the shielding effect.

Further, according to the present invention, there is an effect that it is possible to provide a better wiring harness.

BRIEF DESCRIPTION OF DRAWINGS

FIG. 1A and FIG. 1B are views showing a high-voltage conduction path and a wiring harness according to the present invention.

FIG. 3A and FIG. 3B are views showing a high-voltage conduction path and a wiring harness according to another example of the present invention.

DESCRIPTION OF EMBODIMENTS

A high-voltage conduction path that constitutes a wiring harness includes a positive circuit and a negative circuit in a single-line configuration. One conductor of a positive electrode conductor and a negative electrode conductor is arranged on the inside and the other conductor thereof is arranged on the outside. The other conductor is formed into a cylindrical shape by spirally winding a metal wire material.

First Embodiment

Figure 1A:
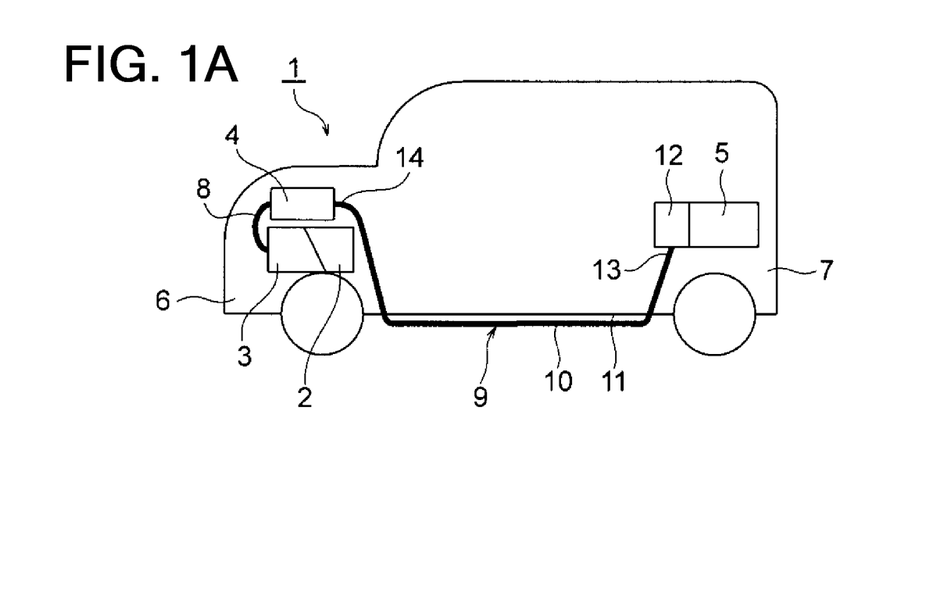
FIG. 1A is a schematic view showing a routed state of the wiring harness and FIG. 1B is a configuration view of the high-voltage conduction path and the wiring harness (First Embodiment).
Figure 1B:
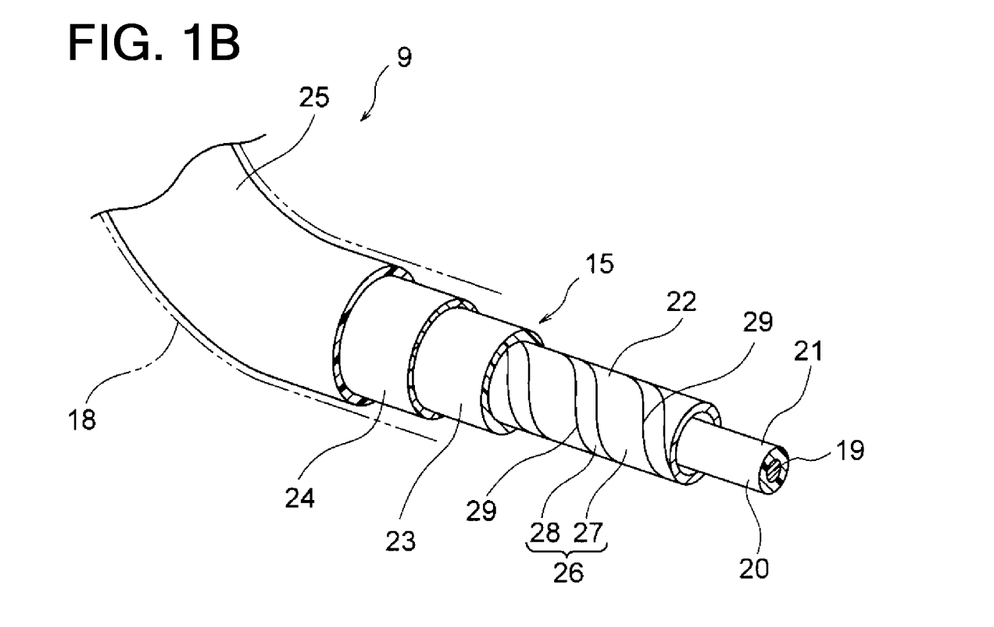
Figure 2:
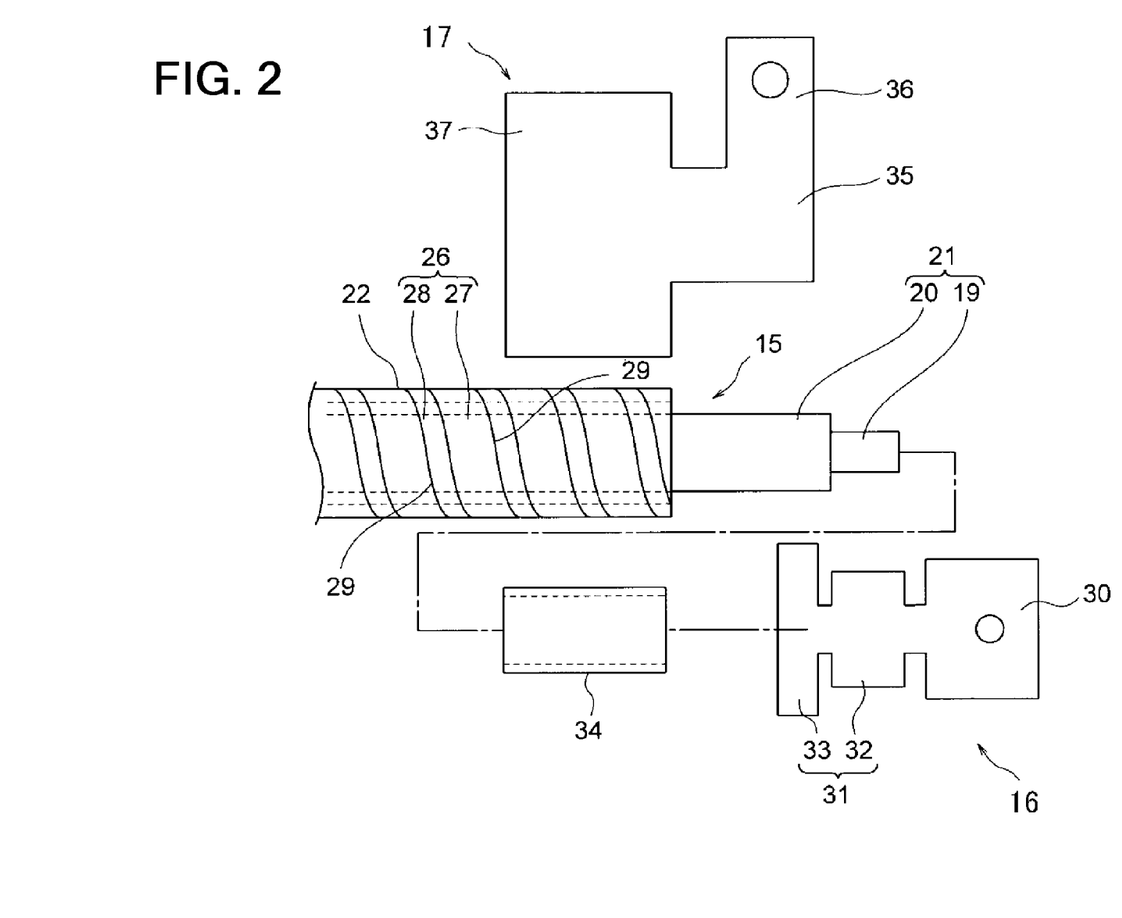
FIG. 2 is an explanatory view showing an end terminal connection structure.

Hereinafter, a first embodiment will be described with reference to the drawings. FIG. 1A and FIG. 1B are views showing a high-voltage conduction path and a wiring harness according to the present invention. FIG. 1A is a schematic view showing a routed state of the wiring harness and FIG. 1B is a configuration view of the high-voltage conduction path and the wiring harness. Further, FIG. 2 is an explanatory view showing an end terminal connection structure.

In the present embodiment, an example where the wiring harness of the present invention is employed in a hybrid vehicle (it is noted that an electric vehicle may be used) is illustratively described.

In FIG. 1A and FIG. 1B, reference numeral 1 indicates a hybrid vehicle. The hybrid vehicle 1 refers to a vehicle that is driven by mixing two power sources of an engine 2 and a motor unit 3. Electric power from a battery 5 (battery pack) is adapted to be supplied to the motor unit 3 via an inverter unit 4. In the present embodiment, the engine 2, the motor unit 3 and the inverter unit 4 are mounted in an engine room 6 at which front wheels or the like are located. Further, the battery 5 is mounted in a vehicle rear part 7 at which rear wheels or the like are located. Further, the battery 5 may be mounted in a vehicle cabin that is present in the rear of the engine room 6.

The motor unit 3 and the inverter unit 4 are connected to each other by a known high-voltage wiring harness 8. Further, the battery 5 and the inverter unit 4 are connected to each other by a wiring harness 9 of the present invention. The wiring harness 9 is used as a high-voltage wiring harness. An intermediate part 10 of the wiring harness 9 is routed on a ground side of a vehicle body under floor 11. Further, the intermediate part 10 is routed along the vehicle body under floor 11. The vehicle body under floor 11 is a known body and also referred to as a so-called panel member. The vehicle body under floor 11 is provided at a predetermined position thereof with a through-hole (reference numeral is not shown). The wiring harness 9 is inserted through the through-hole.

The wiring harness 9 and the battery 5 are connected to each other via a junction block 12 which is provided in the battery 5. A rear end 13 of the wiring harness 9 is connected to the junction block 12 via a connector. The rear end 13 side of the wiring harness 9 is routed on a floor that is a vehicle cabin side. A front end 14 side of the wiring harness 9 is connected to the inverter unit 4 via a connector.

Now, a supplementary explanation of the present embodiment is given. The motor unit 3 is configured to include a motor and a generator. Electric power is supplied to the motor of the motor unit 3 from the junction block 12 provided in the battery (battery pack) 5 on the rear side of a vehicle through the wiring harness 9 according to the present invention and via the inverter unit 4 on the front side of the vehicle. Further, the inverter unit 4 is configured to include an inverter that converts direct current into alternating current and a converter that converts alternating current into direct current. The motor unit 3 is formed as a motor assembly including a shield case. Further, the inverter unit 4 is formed as an inverter assembly including a shield case. The battery 5 is a Ni—MH based or Li-ion based battery and configured as a module. In addition, an electrical storage device such as a capacitor, for example, may be used. The battery 5 is not particularly limited, as long as the battery can be used in the hybrid vehicle 1 or an electric vehicle.

First, a configuration and structure of the wiring harness 9 will be described.

The wiring harness 9 includes a high-voltage conduction path 15 and end terminals 16, 17 (see FIG. 2) that are provided in terminals of the high-voltage conduction path 15. Although the wiring harness 9 of the present embodiment does not include an exterior member to the high-voltage conduction path 15, a conduction path protection member 18 as indicated by an imaginary line in FIG. 1B may be included in the configuration of the wiring harness 9. The conduction path protection member 18 is a known exterior member. Specifically, a corrugated tube or metal pipe, a protector, etc., can be listed, as an example of the conduction path protection member.

The high-voltage conduction path 15 includes a high-voltage electrical power line 21 having a conductor 19 and a first insulator 20, a high-voltage spiral electrical power line 22 provided for covering the high-voltage electrical power line 21, a second insulator 23 covering the high-voltage spiral electrical power line 22, an electromagnetic shielding member 24 provided for covering the second insulator 23 and a sheath 25 covering the electromagnetic shielding member 24.

The conductor 19 corresponds to one conductor of the positive electrode conductor and the negative electrode conductor. Further, the high-voltage spiral electrical power line 22 corresponds to the other conductor of the positive electrode conductor and the negative electrode conductor. In the present embodiment, the conductor 19 is considered as the positive electrode conductor (positive circuit) and the high-voltage spiral electrical power line 22 is considered as the negative electrode conductor (negative circuit). On the contrary to this, the conductor 19 may be considered as the negative electrode conductor (negative circuit) and the high-voltage spiral electrical power line 22 may be considered as the positive electrode conductor (positive circuit).

As material of the conductor 19, a round-bar wire (a conductor structure of a circular single core) made of aluminum or aluminum alloy is employed. In addition, a conductor structure of a busbar shape or a square-bar wire (a conductor structure of a rectangular single core) may be employed. Further, a conductor structure of wires stranded together may be employed. Material is not particularly limited. That is, copper or copper alloy may be employed. In the present embodiment, a conductor made of aluminum is employed since the aluminum is light weight and low cost. The conductor 19 may have rigidity to enable shape retention.

The first insulator 20 is a covering to the conductor 19 and formed by extruding a resin material known in a related art.

The high-voltage electrical power line 21 as described above is accommodated in a hollow portion that is inside the high-voltage spiral electrical power line 22. The high-voltage electrical power line 21 is in contact with an inner surface of the high-voltage spiral electrical power line 22 and therefore the heat generated from the high-voltage electrical power line 21 is absorbed by the high-voltage spiral electrical power line 22. In addition, the high-voltage spiral electrical power line 22 is adapted to be able to disperse the heat absorbed.

The high-voltage spiral electrical power line 22 is made of metal and formed so that the high-voltage electrical power line 21 can be inserted therethrough and accommodated therein. The high-voltage spiral electrical power line 22 of the present embodiment is formed in a substantially cylindrical shape so that a whole length of the high-voltage electrical power line 21 can be inserted therethrough and accommodated therein.

The high-voltage spiral electrical power line 22 is formed by spirally winding the metal wire material 26. The high-voltage spiral electrical power line 22 has flexibility because the metal wire material 26 acts as a spring. In order to impart the flexibility to the high-voltage spiral electrical power line, there is employed a method for spirally winding the metal wire material 26 so that side end faces of the metal wire material 26 opposed to each other come into contact with each other.

The metal wire material 26 is formed in a linear and plate shape (with arbitrary thickness). The metal wire material 26 of the present embodiment includes a first metal wire material 27 and a second metal wire material 28. The first metal wire material 27 and the second metal wire material 28 are formed to have a cross-section shape different from each other. Specifically, the first metal wire material 27 is formed to have a width wider than that of the second metal wire material 28. The high-voltage spiral electrical power line 22 is formed by spirally winding the first metal wire material 27 and the second metal wire material 28, which have a cross-section shape different from each other, in an arrangement where the first metal wire material 27 and the second metal wire material 28 are located to be adjacent to each other, alternately. The high-voltage spiral electrical power line 22 has a spring effect.

Here, reference numeral 29 indicates contact portions between the side end faces opposed to each other, of the first metal wire material 27 and the second metal wire material 28 positioned to be adjacent to each other. The contact portion 29 is a portion where a contact state is formed by an elastic force of metal material, etc. In the contact portion, there is no sticking between the side end faces.

Material of the metal wire material 26 configured by the first metal wire material 27 and the second metal wire material 28 can include aluminum or aluminum alloy, for example. Further, copper or copper alloy, iron, etc., can be also used.

The high-voltage spiral electrical power line 22 is formed in a size equal to or greater than the size (sectional area) of the conductor 19. Specifically, the high-voltage spiral electrical power line 22 is formed in a size of 15 sq or more when the size of the conductor 19 is 15 sq, for example. The reason is that such a size gives an advantage of being able to improve the electrical stability.

Material of the high-voltage spiral electrical power line 22 is selected in consideration of the cost or material of the conductor 19, etc. Although aluminum or aluminum alloy is employed in the present embodiment, copper or copper alloy may be employed.

The second insulator 23 is a covering to the high-voltage spiral electrical power line 22 and formed by extruding a resin material known in a related art.

The electromagnetic shielding member 24 is a member (a member for shielding electromagnetic wave) that is intended for use in electromagnetic shielding and interposed between the second insulator 23 and the sheath 25. The electromagnetic shielding member 24 is formed into a cylindrical shape by a conductive metal foil alone. As long as it is possible to shield the electromagnetic wave, the electromagnetic shielding member 24 may be formed by braids having a plurality of ultrafine wires, for example. When comparing the case of using the metal foil or the braids, the electromagnetic shielding member 24 formed by the metal foil has an advantage of being able to reduce the weight considerably, as compared to the case of using the braids.

The sheath 25 is formed by selecting a resin material whose various properties (such as heat resistance, abrasion resistance, weather resistance, impact resistance, extrusion moldability) are good and then extruding the resin material. The sheath 25 is formed in such a way that a surface thereof corresponds to an outer surface of the high-voltage conduction path 15. The sheath is formed so as to be able to protect the high-voltage conduction path 15 itself from stone splashing or water splashing. The sheath 25 is formed so that an exterior member can be omitted in the high-voltage conduction path 15. On the other hand, the conduction path protection member 18, for example, is used when an exterior member is not omitted.

Although not particularly limited, the sheath 25 may have a two-layer structure of a first sheath and a second sheath. In this case, as material of the first sheath that is located on the inside, PE (polyethylene) is employed, for example. Further, as material of the second sheath that is located on the outside, PP (polypropylene) is employed, for example.

In FIG. 2, the end terminals 16, 17 are electrical connection members that are provided in terminals of the high-voltage conduction path 15 as described above. The end terminals 16, 17 are formed by pressing a conductive metal plate. The end terminal 16 is provided to be used with the high-voltage electrical power line 21 and the end terminal 17 is provided to be used with the high-voltage spiral electrical power line 22.

The end terminal 16 includes an electrical contact portion 30 and a wire connection portion 31. The electrical contact portion 30 is formed to match an end terminal shape of a connection partner (not shown). The wire connection portion 31 includes a conductor crimping portion 32 to crimp the conductor 19 and a covering crimping portion 33 to crimp the first insulator 20.

The end terminal 17 is configured as a two-part component that includes an inner end terminal 34, an outer end terminal 35 and an electrical contact portion 36 that is provided continuously to the outer end terminal 35. The end terminal 17 is formed so as to be able to fix the inner end terminal 34 and the outer end terminal 35 in such a way that the terminal of the high-voltage spiral electrical power line 22 is sandwiched and crimped from the inside and outside thereof. In other words, the inner end terminal 34 is positioned inside of the terminal and comes into contact with an inner surface of the metal wire material 26 and the outer end terminal 35 is positioned outside of the terminal and comes into contact with an outer surface of the metal wire material 26.

The inner end terminal 34 has a cylindrical shape that is inserted between the first insulator 20 and the high-voltage spiral electrical power line 22. The outer end terminal 35 includes a crimping portion 37 to crimp the high-voltage spiral electrical power line 22. The electrical contact portion 36 is formed to match an end terminal shape of a connection partner (not shown). Although an example where the electrical contact portion 36 is formed continuously to the outer end terminal 35 has been described in the present embodiment, the electrical contact portion 36 may be formed continuously to the inner end terminal 34.

Next, an operation of manufacturing the wiring harness 9 with the above-described configuration and structure is described. Here, views relating to the manufacturing operation are omitted. The following description is merely illustrative.

The cylindrical high-voltage spiral electrical power line 22 is formed by spirally winding the metal wire material 26 configured by the first metal wire material 27 and the second metal wire material 28. The second insulator 23 is formed on the outside of the high-voltage spiral electrical power line 22 by extrusion. Further, the electromagnetic shielding member 24 is provided and the sheath 25 is formed by extrusion. Then, the high-voltage spiral electrical power line 22 covered with the sheath 25 or the like is cut so that a full length is a desired length. Then, the high-voltage electrical power line 21 having a predetermined length, which is produced in advance, is inserted (as an example) through an internal space of the high-voltage spiral electrical power line 22 to form the high-voltage conduction path 15 and the end terminals 16, 17 are mounted on a terminal of the high-voltage conduction path 15. In this way, the manufacturing of the wiring harness 9 is completed.

On the other hand, in the wiring harness 9, the metal wire material 26 may be spirally wound so as to cover the high-voltage electrical power line 21 and then the high-voltage spiral electrical power line 22 may be formed.

The wiring harness 9 manufactured as described above is rounded in a state where it is easy to transport, for example, and accommodated in a tote box (not shown) or the like. Then, the wiring harness 9 is transported to an assembly factory of a vehicle manufacturer, for example. After being transported to the assembly factory, the wiring harness is taken out from a tote box (not shown) and then fixedly mounted to the vehicle body under floor 11 or the like. Then, electric connection or the like is performed through the end terminals 16, 17 whereby the routing of the wiring harness 9 is completed.

Although not particularly limited, a known protector or the like is used in maintaining the bent state of the wiring harness 9. Further, mounting fixation of the wiring harness to the vehicle body under floor 11 or the like is performed by using a known clamp or the like.

Although the routed position of the wiring harness 9 is set in the vehicle body under floor 11 or the like in the present embodiment, the routed position is not limited to such a position.

Hereinabove, as has been described with reference to FIG. 1A to FIG. 2, according to the present invention, the positive electrode conductor (conductor 19 that is a positive circuit) and the negative electrode conductor (high-voltage spiral electrical power line 22 that is a negative circuit) are included in a single high-voltage conduction path 15. Accordingly, there is an effect that it is possible to achieve space saving, as compared to a conventional example where two conduction paths are disposed side by side.

Further, according to the present invention, since the high-voltage electrical power line 21 or the high-voltage spiral electrical power line 22 that is located outside of the high-voltage electrical power line 21 has flexibility, there is an effect that the high-voltage conduction path 15 can be formed into a desired bent shape. In other words, there is an effect that path formation can be facilitated.

Second Embodiment

Figure 3A:
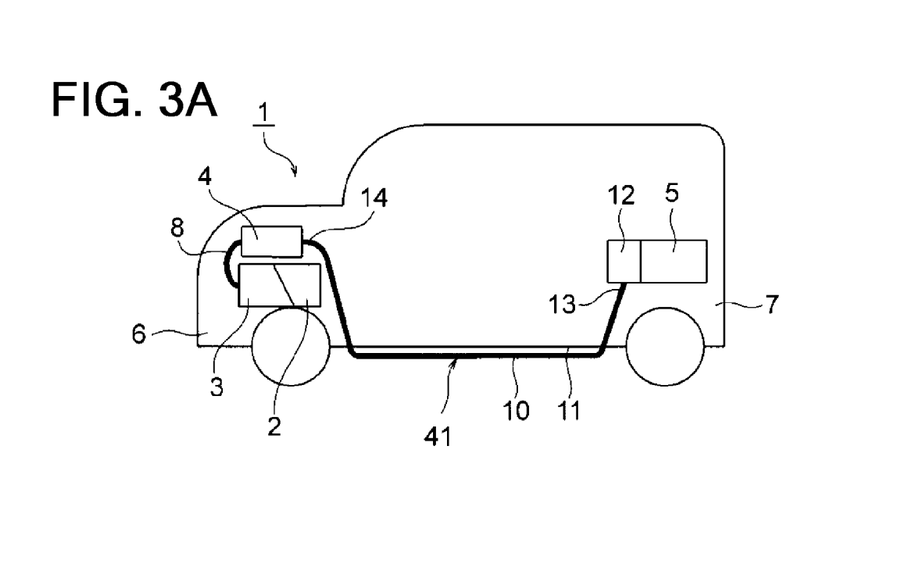
FIG. 3A is a schematic view showing a routed state of the wiring harness and FIG. 3B is a configuration view of the high-voltage conduction path and the wiring harness (Second Embodiment).
Figure 3B:
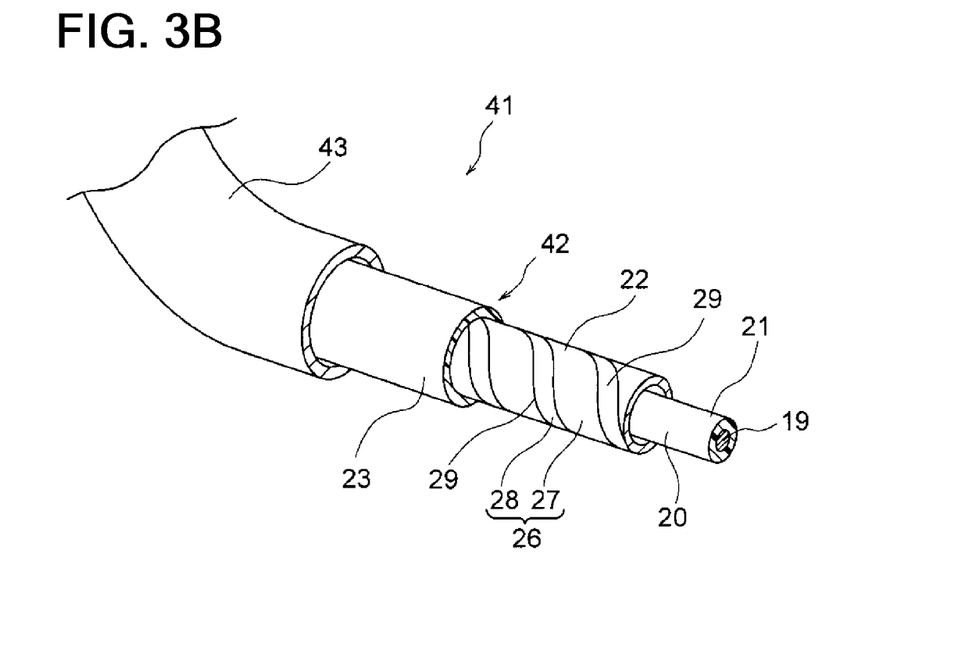

Hereinafter, a second embodiment is described with reference to the drawings. FIG. 3A and FIG. 3B are views showing a high-voltage conduction path and a wiring harness according to another example of the present invention. FIG. 3A is a schematic view showing a routed state of the wiring harness and FIG. 3B is a configuration view of the high-voltage conduction path and the wiring harness. Here, the same element will be denoted by the same reference numeral as that of the first embodiment and a duplicated explanation thereof will be omitted.

In FIG. 3A and FIG. 3B, a wiring harness 41 is routed in the same position as the first embodiment. The wiring harness 41 includes a high-voltage conduction path 42, terminals (see terminals 16, 17 shown in FIG. 2) provided in a terminal of the high-voltage conduction path 42 and a metal pipe 43 as an exterior member, for example.

The high-voltage conduction path 42 includes a high-voltage electrical power line 21 having a conductor 19 and a first insulator 20, a high-voltage spiral electrical power line 22 provided for covering the high-voltage electrical power line 21 and a second insulator 23 covering the high-voltage spiral electrical power line 22.

The metal pipe 43 is included as an exterior member for the high-voltage conduction path 42. In addition, the metal pipe may be the conduction path protection member 18 of the first embodiment that is a corrugated tube or protector, etc.

Of course, the wiring harness 41 of the second embodiment has the same effects as the wiring harness 9 of the first embodiment.

In addition, it is, of course, that the present invention can be variously modified and implemented in a range without changing the gist of the invention.

Here, characteristics of the high-voltage conduction path and the wiring harness according to the above-described embodiments of the present invention are briefly summarized and listed in the following sections i to v, respectively.

[i] A high-voltage conduction path (15) includes one conductor (19) of a positive electrode conductor and a negative electrode conductor, a first insulator (20) provided on the outside of the one conductor (19), the other conductor (22) of the positive electrode conductor and the negative electrode conductor, the other conductor being provided on the outside of the first insulator (20), and a second insulator (23) provided on the outside of the other conductor (22). The other conductor (22) is made of a metal wire material (26) and formed into a cylindrical shape by spirally winding the metal wire material (26). Portions of the metal wire material (26) positioned to be adjacent to each other contact with each other at faces opposed to each other.

[ii] In the high-voltage conduction path (15) described in above [i], the metal wire material (26) includes a first metal wire material (27) and a second metal wire material (28), which have a cross-section shape different from each other. The other conductor (22) is formed by spirally winding the first metal wire material (27) and the second metal wire material (28) and portions of the first metal wire material (27) and the second metal wire material (28) positioned to be alternately adjacent to each other contact with each other at side end faces opposed to each other.

[iii] In the high-voltage conduction path (15) described in above [i] or [ii], the high-voltage conduction path (15) further includes an end terminal (17) connected to a terminal of the other conductor (22). The end terminal (17) includes an inner end terminal (34) that is positioned inside of the terminal and comes into contact with an inner surface of the metal wire material (26), an outer end terminal (35) that is positioned outside of the terminal and comes into contact with an outer surface of the metal wire material (26) and an electrical contact portion (36) for external connection provided continuously to one end terminal of the inner end terminal (34) and the outer end terminal (35).

[iv] In the high-voltage conduction path (15) described in any one of above [i] to [iii], the high-voltage conduction path (15) further includes an electromagnetic shielding member (24) provided on the outside of the second insulator (23) and a sheath (25) provided on the outside of the electromagnetic shielding member (24).

[v] A wiring harness (9) includes the high-voltage conduction path (15) described in any one of above [i] to [iv].

Although the present invention has been described in detail with reference to the particular embodiments, it is obvious to those skilled in the art that the particular embodiments can be variously modified and changed without departing a spirit and a scope of the present invention.

INDUSTRIAL APPLICABILITY

The present invention is useful in the field of a high-voltage conduction path and a wiring harness.

REFERENCE NUMERALS LIST

1 . . . Hybrid Vehicle
2 . . . Engine
3 . . . Motor Unit
4 . . . Inverter Unit
5 . . . Battery
6 . . . Engine Room
7 . . . Vehicle Rear Part
8 . . . High-Voltage Wiring harness
9 . . . Wiring harness
10 . . . Intermediate Part
11 . . . Vehicle Body Under Floor
12 . . . Junction Block
13 . . . Rear End
14 . . . Front End
15 . . . High-Voltage Conduction path
16, 17 . . . End Terminal
18 . . . Conduction path Protection Member
19 . . . Conductor (Positive Electrode Conductor, One Conductor)
20 . . . First Insulator
21 . . . High-Voltage Electrical Power Line
22 . . . High-Voltage Spiral Electrical Power Line (Negative Electrode Conductor, The other Conductor)
23 . . . Second Insulator
24 . . . Electromagnetic Shielding Member
25 . . . Sheath
26 . . . Metal Wire Material
27 . . . First Metal Wire Material
28 . . . Second Metal Wire Material
29 . . . Contact Portion
30 . . . Electrical Contact Portion
31 . . . Wire Connection Portion
32 . . . Conductor Crimping Portion
33 . . . Covering Crimping Portion
34 . . . Inner End Terminal
35 . . . Outer End Terminal
36 . . . Electrical Contact Portion
41 . . . Wiring harness
42 . . . High-Voltage Conduction path
43 . . . Metal Pipe

What is claimed is:

1. A high-voltage conduction path comprising:
one conductor of a positive electrode conductor and a negative electrode conductor;
a first insulator that is provided on the outside of the one conductor;
the other conductor of the positive electrode conductor and the negative electrode conductor, the other conductor being provided on the outside of the first insulator; and
a second insulator that is provided on the outside of the other conductor,
wherein the other conductor is made of a metal wire material and formed into a cylindrical shape by spirally winding the metal wire material, and portions of the metal wire material positioned to be adjacent to each other contact with each other at side end faces opposed to each other, the cylindrical shape being hollow and configured to receive the one conductor and the first insulator,
the metal wire material includes a first metal wire material and a second metal wire material having a cross-section shape different from a cross-section shape of the first metal wire material, and
the other conductor is formed by spirally winding the first metal wire material and the second metal wire material and portions of the first metal wire material and the second metal wire material positioned to be alternately adjacent to each other contact at side end faces opposed to each other.

2. The high-voltage conduction path according to claim 1, further comprising an end terminal connected to a terminal of the other conductor,
wherein the end terminal includes an inner end terminal that is positioned inside of the terminal and comes into contact with an inner surface of the metal wire material, an outer end terminal that is positioned outside of the terminal and comes into contact with an outer surface of the metal wire material and an electrical contact portion for external connection provided continuously to one end terminal of the inner end terminal and the outer end terminal.

3. The high-voltage conduction path according to claim 1, further comprising:
an electromagnetic shielding member that is provided on the outside of the second insulator; and
a sheath that is provided on the outside of the electromagnetic shielding member.

4. A wiring harness comprising the high-voltage conduction path according to claim 1.

5. The high-voltage conduction path according to claim 1, further comprising:
an electromagnetic shielding member that is provided on the outside of the second insulator, the electromagnetic shielding member comprising a metal foil.

6. The high-voltage conduction path according to claim 5, further comprising:
a sheath that is provided on the outside of the electromagnetic shielding member, the sheath comprising a first layer and a second layer, the second layer formed outside of the first layer, wherein the second layer comprises polypropylene.

* * * * *